Nov. 22, 1966 P. F. BORTH 3,287,191

ETCHING OF PRINTED CIRCUIT COMPONENTS

Filed July 23, 1963

INVENTOR.
PAUL F. BORTH
BY Blum, Moscovitz,
Friedman, Blum & Kaplan
ATTORNEYS

United States Patent Office 3,287,191

Patented Nov. 22, 1966

3,287,191

ETCHING OF PRINTED CIRCUIT COMPONENTS

Paul F. Borth, Park Forest, Ill., assignor to Photo-Engravers Research Inc., Savannah, Ga., a corporation of Georgia Filed July 23, 1963, Ser. No. 297,147
9 Claims. (Cl. 156—3)

Figure 1:
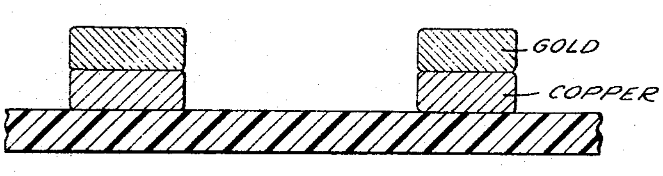

The present invention is concerned with improved means for forming printed circuit components wherein metals more noble than copper are deposited on a copper base. More specifically, the present invention is concerned with removing unwanted copper from such printed circuit components in a manner effectively removing undesired copper without resulting in undercutting of the raised metal portion of the printed circuit. This application is a continuation-in-part of copending application Serial No. 127,779, filed in the name of Bradley and Borth on June 22, 1961, now issued as U.S. Patent No. 3,161,552 on December 15, 1964.

The formation of printed circuit components is now quite well known in the art. Typically a metal such as copper is adhered to a base sheet normally made of plastic, with a pattern conforming to the desired wiring, etc., being formed on the copper. Portions of the copper are protected against the action of an etching bath, while other areas of the plate are not, so that the etching bath serves to remove undesired copper and form the desired image in relief.

While in general simple copper printed circuits have been etched successfuly by various techniques, considerable difficulty has been encountered in treating a printed circuit wherein a metal more noble than copper, e.g., platinum metals, has been deposited upon the copper. In particular, printed etching circuits characterized by deposition of gold and/or silver on the copper have presented difficulties. The steps by which such printed circuits are made prior to immersion in an etching bath are well known in the art, and, per se, form no part of the present invention. Generally, such printed circuit components are made by first adhering copper to a base non-conducting surface, normally a plastic or the like. The copper is then coated with a light sensitive photographic film or enamel, and then imprinted by exposure to light through a positive photographic image so as to obtain a negative image on the plate corresponding to the pattern desired. Thereafter, gold and/or silver is plated on to the corresponding non-resist surfaces of the copper plate by placing the copper plating in a suitable bath of the desired plating metal. The photo-resist material, which may be Kodak Photo-Resist (KPR), is then dissolved off by the use of conventional solvents such as toluol, benzol, cyanide, hydroxide, etc., depending on the photo-resist employed. Thereafter, it is necessary to contact the plated copper with an etching bath in order to remove the non-resist metal areas and cause the resist area of the metal to stand out in vertical relief.

When such printed circuit components having a metal more noble than copper, e.g., gold or silver, deposited on the copper were subjected to conventional etching techniques, poor results were obtained. Thus, conventional etching by contacting with a ferric chloride bath resulted in substantial undercutting along the sides of the copper metal supporting the more noble metal. This is undesirable since the dimensions positioning electrical resistance and mechanical strength of the various circuit components are undesirably modified from their design value.

Further, when it was attempted to employ various of the newly taught powderless etching techniques to this problem relatively poor results also were obtained. Thus etching baths of ferric chloride containing such passivating agents as formamidine disulfide, ethylene thiourea, etc., while giving protection against undercutting result in a plate having too much copper remaining, normally a narrow line of unetched copper tending to remain along the edges of the nobler metal, e.g., gold image.

It has now been found that a specific formulation gives exceptionally good results in terms of removing undesired copper while at the same time protecting against undercutting of the raised image area. Printed etching circuits containing metals more noble than copper, e.g., gold and/or silver deposited on copper, are effectively etched by subjecting them to etching with a ferric chloride etching bath containing the combination of (1) ethylene thiourea or substituted ethylene thiourea and (2) an organic ring modifying agent represented by the formula:

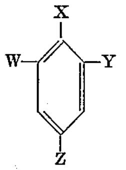

wherein W, X, Y, and Z are each selected from the group consisting of nitroso, amino, lower alkyl substituted amino, acid radical of a lower fatty acid, hydroxy and hydrogen with the proviso that at least two of W, X, Y and Z are other than hydrogen and are in ortho or para relation.

With respect to the modifying agents, suitable lower alkyl radicals include substituted amino, the requirement that the modifying agent be soluble in the etching bath limiting the alkyl groups to the lower members such as the $C_1$ radical. The same consideration limits the acid radicals of lower fatty acids which can be included to the lower members such as acetic acid. Specific examples of modifying agents are the following: pyrogallol, 2,4-diaminophenol dihydrochloride, tannic acid, hydroquinone, p-benzoquinone, catechol o-benzoquinone, picric acid, 2,4-dinitrophenol, 4-amino-2-nitrophenol, p - phenylenediamine, o-phenylenediamine, o-aminophenol.

Particularly preferred are pyrogallol, 2,4-diaminophenol and tannic acid. Especially desirable is 2,4-diaminophenol dihydrochloride which is available commercially under the name Amidol (see page 334 of the Merck Index, 7th Edition). The diaminophenol can be used as the hydrochloride or other acid salts such as the dihydrochloride.

Such organic ring compounds are described in Serial No. 127,779, filed June 22, 1961, in the names of Bradley and Borth, issued as U.S. Patent No. 3,161,552 on December 15, 1964.

In addition to ethylene thiourea, the present compositions may contain suitably substituted ethylene thiourea compounds, i.e., those in which one or more of the hydrogen atoms are replaced by an alkyl group or an aryl group or those in which an acyl group is joined to the sulfur atom. Examples of such groups are methylethylpropyl, isopropylphenol, diphenol, acetylbutyral, etc. There can be more than one substituent on the ring, with the substituents either being the same or different provided that the substituted ethylene thiourea have a water solubility of at least 0.5 gram per liter. Ethylene thiourea, however, is generally preferred.

The etching solutions will contain conventional amounts of ferric chloride in addition to (1) ethylene thiourea or substituted ethylene thiourea and (2) the aforesaid organic ring compounds. Thus the compositions typically are aqueous solutions of ferric chloride in distilled water ranging from 20° Baumé to 48° Baumé, i.e., corresponding to adding anhydrous ferric chloride in the range of 200 to 460 grams per liter of water. The etching bath will normally contain 1 to 8, preferably 1.5 to 3 grams of ethylene thiourea or substituted ethylene thiourea per liter of bath. Similarly, the baths will generally contain 0.1 to 10 grams of organic ring modifying agent. When employing 2,4-diaminophenol, the bath preferably contains 0.1 to 0.8 grams per liter, with a ratio of modifying agent to ethylene thiourea compound preferably ranging from 5 percent to 20 percent.

The present etching solutions have been found to give markedly superior results when treating printed circuit components characterized by metals such as gold and/or silver deposited on a copper surface, than is realized by the use of various conventional etching solutions such as ferric chloride alone, or in combinaiton with various passivating agents (powderless copper etching) such as formamidine disulfide. The unique nature of the present invention is emphasized by the fact that a ferric chloride etching bath containing ethylene thiourea (without the organic ring modifying agent) fails to give the desired results, as does an etching bath containing formamidine disulfide, ethylene thiourea and the organic ring compound together.

The various aspects and modifications of the present invention will be made more clearly apparent by reference to the following description, examples and accompanying drawings.

Figure 2:
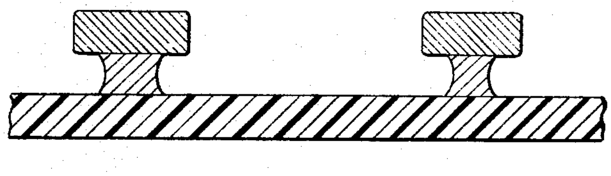
Figure 3:
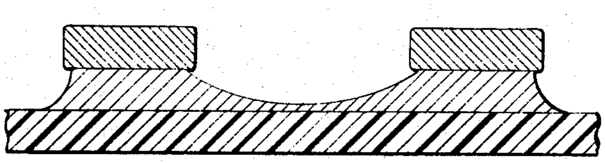
Figure 4:
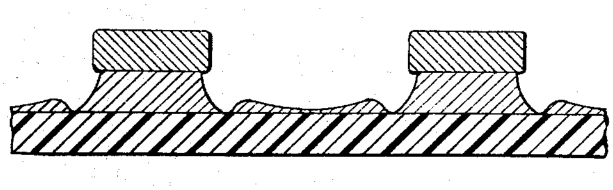

FIGURES 1 through 4 illustrate the configuration of printed circuit components wherein a metal such as gold is deposited on copper which is supported on a plastic base, and the resulting circuit component subjected to etching by various procedures. In particular, FIGURE 1 is illustrative of the results obtained by the present invention whereas FIGURES 2 through 4 are illustrative of the use of other techniques.

*Examples 1 through 5*

A printed circuit component wherein a layer of copper was adhered to a non-conductive base sheet of fiberglass reinforced epoxy resin, and a pattern of gold was plated thereon was employed in the following tests. The samples employed in each test were made by the same process. The printed circuit component was produced by laminating copper foil to a fiberglass reinforced epoxy resin sheet. The image of the circuit was photoprinted onto a layer of Kodak Photo Resist coated on the copper surface. The surface was developed in KPR Developer. Gold was then electroplated onto the exposed areas. The Kodak Photo Resist image was removed by appropriate solvent (benzol, toluol). The board was then ready for removal of exposed copper by etching.

Thereafter in each of the following tests the gold plated circuit board was etched in a 30° Baumé aqueous ferric chloride bath. In all the following examples, etching was effected in a Master etching machine, having two counter-rotating paddles 8″ in diameter at 80° F., with a 600 r.p.m. paddle speed. The plates were suspended face down approximately 9″ above the center-line of the paddles.

In Example 1 the gold plated circuit board was etched with an etching bath containing only the ferric chloride. Results are indicated in FIGURE 2.

In Example 2 the gold plated circuit board was etched in a bath containing 2 grams of formamidine disulfide per liter of 30° Baumé ferric chloride with results being indicated in FIGURE 3.

In Example 3, the same procedure was employed only a 30° Baumé ferric chloride bath containing 2.8 grams per liter of a mixture of organic compounds consisting of 44 wt. percent of formamidine disulfide, 47 wt. percent ethylene thiourea, 9 wt. percent Amidol (2,4-diaminophenol dihydrochloride) was employed.

In other tests (Example 4) the same gold plated circuit board (a fresh portion thereof) was contacted in the same manner with an etching bath of 30° Baumé ferric chloride which contained 2 grams of ethylene thiourea as a passivating agent. Results are shown in FIGURE 4.

As indicated in FIGURES 2, 3 and 4, the prior art etching baths which have been found to be suitable for treatment of photo-engraving copper, etc., are unsuitable in treating a printed circuit component wherein a metal more noble than copper has been deposited thereon, e.g., gold on copper. In particular, the use of ferric chloride alone gives excessive undercutting, whereas the use of the aforesaid etching baths containing passivating agents, while protecting against undercutting, did not sufficiently remove copper from the circuit board element (FIGURES 3 and 4). Examples 2 and 3 gave similar results of the type illustrated in FIGURE 3.

In contrast to the above, in Example 5, the same procedure was employed in contacting the same type of gold plated copper circuit board with a bath containing 30° Baumé ferric chloride, as well as 2 grams of ethylene thiourea per liter and 0.2 gram of Amidol (2,4-diaminophenol dihydrochloride) per liter. Results are depicted in FIGURE 1.

As will be seen from FIGURE 1, excellent etching was obtained. Undesired copper was removed from the surface of the plastic board in a manner giving sharp delineation of the gold plated relief pattern, yet avoiding undercutting of the raised portion of the surface.

As seen from the above comparison, etching bath compositions of the present invention give excellent etching of a gold on copper printed circuit component whereas various other etching solutions which are suitable for treating copper photoengraving plates fail to give desired results.

*Examples 6 and 7*

A printed circuit element which was characterized by silver being plated on a copper surface in the same manner as described was tested in Examples 1–5, the circuit element being made by the similar procedure to that described with respect to the gold plated element. Use of the compositions of Examples 1, 2, 3 and 4 gave substantially the same results as that obtained with the gold plate element. However, when the silver was etched by the use of a 30° Baumé ferric chloride etching bath containing 2 grams of ethylene thiourea per liter and 0.2 gram of Amidol per liter, results as illustrated in FIGURE 1 were obtained, thus evidencing the applicability of the present invention to the treatment of printed circuit components wherein silver has been deposited on a copper base.

The same series of tests described in Example 6 were conducted on a printed circuit component wherein gold had been plated on the silver coated copper printing circuit component (Example 7). The same observations were made, namely, only the combination of ethylene thiourea and Amidol gave desired results when etching the sample with a ferric chloride solution.

*Examples 8 through 11*

The same type printed circuit component containing a layer of gold deposited on copper foil bound to a fiberglass epoxy resin sheet described in Examples 1 through 5 was subjected to etching with the following bath compositions. All of the following compositions which may be characterized as ferric chloride etching baths containing an ethylene thiourea compound and an organic ring modifying agent of the type described previously gave desired results of the type illustrated in FIGURE 1. Thus these examples further illustrate other compositons suitable for the practice of the present invention.

| | Grams per liter |
|---|---|
| *Example 8.*—Ferric chloride—30° Bé.: | |
| Ethylene thiourea | 2.0 |
| 2,4 dinitrophenol | 4.5 |
| *Example 9.*—Ferric chloride—30° Bé.: | |
| Ethylene thiourea | 2.0 |
| Pyrogallol | 4.5 |
| *Example 10.*—Ferric chloride—30° Bé.: | |
| Ethylene thiourea | 2.0 |
| Picric acid | 3.8 |
| *Example 11.*—Ferric chloride—30° Bé.: | |
| Ethylene thiourea | 2.0 |
| Tannic acid | 7.6 |

In all cases, etching was in a Master etching machine, having two counter-rotating paddles 8" in diameter, at 80° F., 600 r.p.m. paddle speed. The plates were suspended face down approximately 9" above the center-line of the paddles.

The printed circuit components may be etched in accordance with the present invention by utilizing any of various conventional techniques employed for treating photoengraving copper plate. Thus etching can be effected by use of means for supplying sufficient mechanical action to remove the protecting film from the surface to be etched, such as spraying the solution against the metal surface, impingement of the solution in the form of a jet, a mild brushing action, etc. Preferably the solution is splashed on the copper surface by means of a rotary paddle wheel provided with planar paddles which, upon rotation, cause impingement of the liquid in a substantially single direction so as to clean the surface to be etched from film while maintaining a protective film on the areas subjected to undercutting.

Various modifications may be made to the present invention. For example, it may be desirable to treat a printed circuit element wherein gold has been deposited on a copper surface which has been coated with silver, i.e., gold on silver on copper or vice versa.

Having described the present invention, that which is sought to be protected is set forth in the following claims.

I claim:

1. In the etching of a printed circuit component characterized by the use of a metal more noble than copper deposited on copper, wherein it is desired to etch away undesired copper, the improvement which comprises etching said component with an aqueous ferric chloride etching solution additionally containing a mixture of agents consisting essentially of (1) a member of the group consisting of ethylene thiourea and substituted ethylene thiourea, and (2) a film modifier which forms in said ferric chloride solution a compound of the formula:

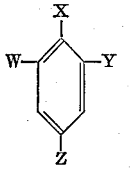

wherein, W, X, Y and Z are each selected from the group consisting of nitroso, amino, lower alkyl substituted amino, acid radical of a lower fatty acid, hydroxy, and hydrogen with the proviso that at least two of W, X, Y and Z are other than hydrogen and are in ortho or para relation.

2. The improvement of claim 1 wherein said metal more noble than copper is gold.

3. The improvement of claim 1 wherein said metal more noble than copper is silver.

4. The improvement of claim 1 wherein said film modifier is 2,4-diaminophenol dihydrochloride.

5. The improvement of claim 1 wherein said etching bath contains, per liter of bath, 200 to 460 grams of ferric chloride, 1 to 8 grams of ethylene thiourea and 0.1 to 0.8 gram of 2,4-diaminophenol dihydrochloride.

6. The improvement of claim 1 wherein said film modifier is 2,4-dinitrophenol.

7. The improvement of claim 1 wherein said film modifier is pyrogallol.

8. The improvement of claim 1 wherein said film modifier is picric acid.

9. The improvement of claim 1 wherein said film modifier is tannic acid.

References Cited by the Examiner

UNITED STATES PATENTS

| | | | |
|---|---|---|---|
| 124,905 | 3/1872 | McGill et al. | 156—13 |
| 3,075,866 | 1/1963 | Baker et al. | 156—13 |
| 3,161,552 | 12/1964 | Bradley et al. | 156—14 |

ALEXANDER WYMAN, *Primary Examiner.*

JACOB STEINBERG, *Examiner.*